(12) United States Patent
Kim et al.

(10) Patent No.: US 10,657,300 B1
(45) Date of Patent: *May 19, 2020

(54) PREDICTIVE DESIGN SPACE METRICS FOR MATERIALS DEVELOPMENT

(71) Applicant: Citrine Informatics, Inc., Redwood City, CA (US)

(72) Inventors: Yoolhee Kim, Oakland, CA (US); Erin Melissa Tan Antono, Palo Alto, CA (US); Edward Soo Kim, Medicine Hat (CA); Bryce William Meredig, San Carlos, CA (US); Julia Black Ling, Redwood City, CA (US)

(73) Assignee: CITRINE INFORMATICS, INC., Redwood City, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/591,524

(22) Filed: Oct. 2, 2019

Related U.S. Application Data (63) Continuation of application No. 16/568,701, filed on Sep. 12, 2019.

(Continued)

(51) Int. Cl.
*G06F 30/20* (2020.01)
*G06N 20/00* (2019.01)
*G06N 7/00* (2006.01)

(52) U.S. Cl.
CPC ............ *G06F 30/20* (2020.01); *G06N 7/005* (2013.01); *G06N 20/00* (2019.01)

(58) Field of Classification Search
CPC ........ G06N 20/00; G06N 7/005; G06F 30/00; G16C 20/70; G16C 20/30
See application file for complete search history.

(56) References Cited

U.S. PATENT DOCUMENTS 10,366,779 B2 * 7/2019 Hsu .................... G16C 20/30

OTHER PUBLICATIONS

Abhijith M. Gopakumar, Prasanna V. Balachandran, Dezhen Xue, James E. Gubernatis, and Turab Lookman. "Multi-objective Optimization for Materials Discovery via Adaptive Design", Feb. 27, 2018, Scientific Reports 8:3738, pp. 1-12. (Year: 2018).*

(Continued)

*Primary Examiner* — Kamran Afshar
*Assistant Examiner* — Ying Yu Chen
(74) *Attorney, Agent, or Firm* — Fenwick & West LLP (57) ABSTRACT

A system and a method are disclosed for predicting design space quality for materials development and manufacture. In an embodiment, a processor receives input of a material property and a design space. The processor identifies a best data point. For each respective candidate material of the design space, the processor receives, as output from a model, a respective property value. The processor determines respective property values that exceed the property value of the best data point adds them to a subset of candidate materials. The processor determines a PFIC score for candidates in the subset. The processor generates a plurality of curves, each reflecting a respective probability distribution of property values. The processor determines a CMLI score based on the plurality of respective curves. The processor determines that the design space is high quality based on the PFIC and CMLI scores, and outputs a recommendation to proceed.

18 Claims, 7 Drawing Sheets

Related U.S. Application Data (60) Provisional application No. 62/810,291, filed on Feb. 25, 2019.

(56) References Cited

OTHER PUBLICATIONS

Tu C. Le and David A. Winkler, "Discovery and Optimization of Materials Using Evolutionary Approaches", May 12, 2016, Chem. Rev. 2016, 116, pp. 6107-6132. (Year: 2016).*

Julia Ling, Maxwell Hutchinson, Erin Antono, Sean Paradiso, and Bryce Meredig. "High-Dimensional Materials and Process Optimization Using Data-Driven Experimental Design with Well-Calibrated Uncertainty Estimates", Jul. 5, 2017, Integr Mater Manuf Innov (2017) 6, pp. 207-217. (Year: 2017).*

\* cited by examiner

PREDICTIVE DESIGN SPACE METRICS FOR MATERIALS DEVELOPMENT

CROSS REFERENCE TO RELATED APPLICATIONS

This application claims the benefit of U.S. application Ser. No. 16/568,701, filed Sep. 12, 2019 which claims the benefit of U.S. Provisional Application No. 62/810,291, filed Feb. 25, 2019, the disclosure of which is hereby incorporated by reference herein in its entirety.

TECHNICAL FIELD

The disclosure generally relates to the field of materials informatics and materials development, and more particularly relates to artificial intelligence (AI)-assisted materials development techniques to accelerate the discovery of high performance materials for manufacture.

BACKGROUND

Manufacturers are often tasked with creating objects with properties satisfying certain specifications. For example, a specification may be made that an object will not break easily when pulled, thus requiring tensile strength of at least 100 megapascals (MPa). Exhaustively testing large amounts of, or various sets of, candidate materials to determine whether they satisfy specified manufacturing parameters requires immense expenditure of time, manpower, and funds, and is commercially infeasible.

Existing systems access data from previously performed experiments to identify, using a machine learning model, candidate materials that, based on the data, may satisfy the specified manufacturing parameters. After identifying the candidate materials, experiments are performed on these candidate materials to determine whether any are improvements over known materials with respect to the manufacturing parameters. Problematically, these existing systems provide no indicia of how likely a set of candidates is to contain a candidate that satisfies the parameters, and thus using such systems may be an expensive and time-consuming process that ultimately yields no viable materials.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

Figure (FIG. 1 illustrates one embodiment of a system including a design space evaluation service that determines the probability of an improved material being within a design space.

DETAILED DESCRIPTION

The Figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

One embodiment of a disclosed system, method and computer readable storage medium includes a system for evaluating design space quality for materials development applications. The system implements predictive metrics to determine, using machine learning models, a likelihood of whether a material that is an improvement over a best known candidate is within a design space. If the likelihood is high enough, a designer will have confidence in iterating over that design space to determine whether an improved material is therein, thus improving efficiency in obtaining improved materials to be used in manufacturing an object according to desired parameters.

In an embodiment, a design space evaluation service receives input, by a user, of a specified material property and a design space, the design space including a plurality of candidate materials. The design space evaluation service identifies a best data point, from a set of training data that was used to train a first model, having a highest property value of the set for the specified material property. The best data point may be a best known value for a property value specified for an object to be manufactured. The design space evaluation service may, for each respective candidate material of the design space, input the respective candidate material into the first model, receive, as output from the first model, a respective property value for the specified material property, and determine whether the respective property value exceeds the property value of the best data point. Responsive to determining that the respective property value exceeds the property value of the data point, the design space evaluation service may add the respective candidate material to a subset of candidate materials.

The design space evaluation service may determine a Predicted Fraction of Improved Candidates (PFIC) score by dividing a total number of candidate materials in the subset of candidate materials by a total number of candidate materials in the design space. The PFIC score is used to identify high quality design spaces; that is, if a large number of the candidate materials that have a higher value than a best known material, then the PFIC score will be high, which indicates that the quality of the design space is high.

The design space evaluation service may generate, using a second model, a plurality of curves, each respective curve of the plurality of curves reflecting a respective probability distribution of property values for the specified material property that a respective candidate material will yield. The design space evaluation service may then determine a Cumulative Maximum Likelihood of Improvement (CMLI) score that indicates the probability that the design space includes at least one candidate material with a property value that exceeds the property value of the best data point based on a subset of the plurality of respective curves. The CMLI score, for example, can be used to identify poor design spaces, in that a low probability will indicate that the design space is unlikely to yield any candidate materials that have a property value that exceeds the property value of the best data point.

The design space evaluation service may determine whether the design space is of high quality based on both the PFIC score exceeding a PFIC threshold score, and the CMLI score exceeding a CMLI threshold score, which would indicate both that the design space is likely to have a candidate whose performance exceeds the best data point, and that the probability of finding such candidate materials is high. Responsive to determining that the design space is of high quality, the design space evaluation service may output, to the user, a recommendation to proceed with the design space. For example, a user may be recommended to iterate over the design space to seek out a material for use in manufacture.

System Environment for Design Space Evaluation Service

Figure 1:
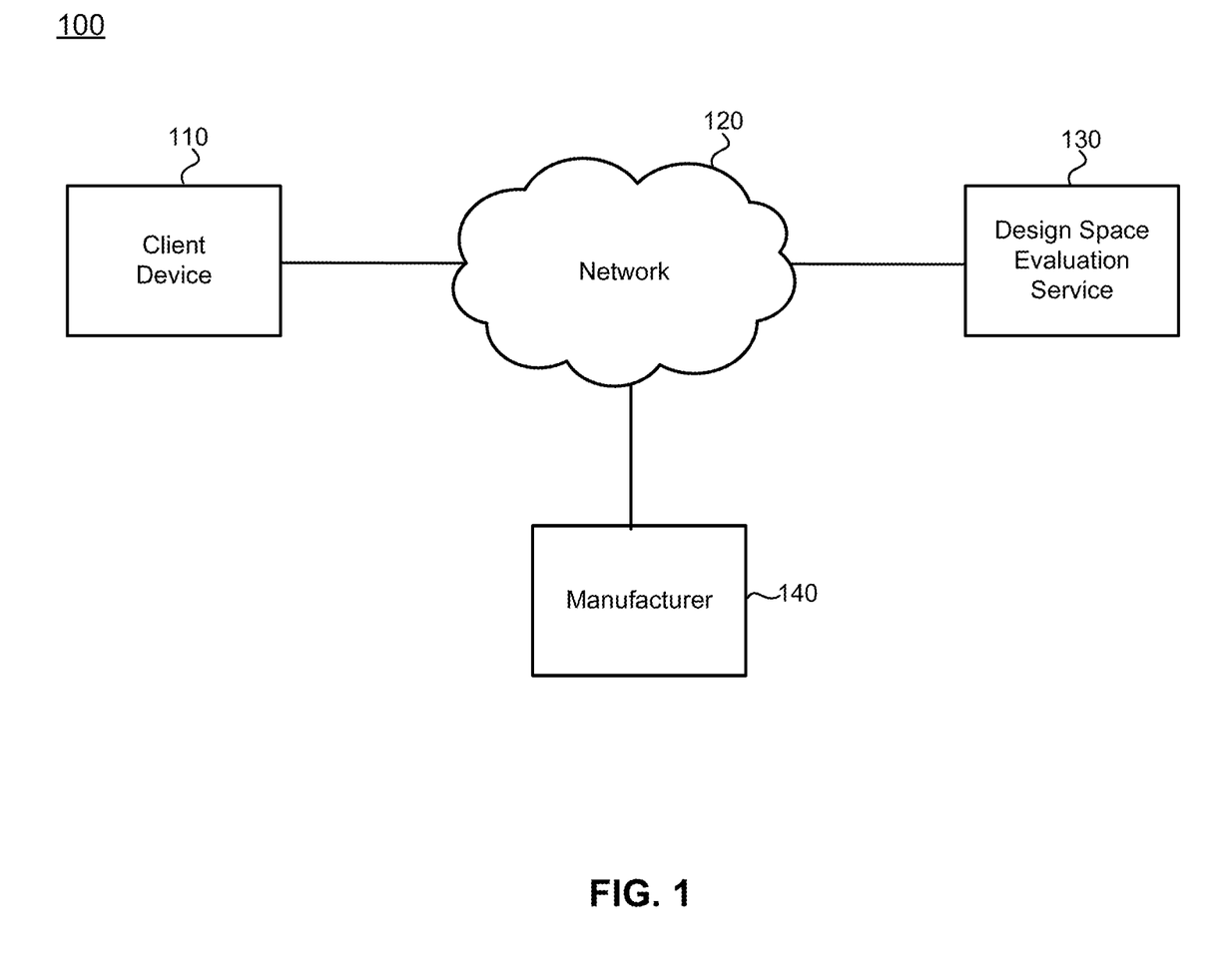

FIG. 1 illustrates one embodiment of a system including a design space evaluation service that determines the probability of an improved material being within a design space. Environment 100 includes client device 110, network 120, design space evaluation service, and optionally, manufacturer 140. Client device 110 may be a device used by a user to input parameters for a design space. For example, client device 110 may be a personal computer, a mobile device like a mobile phone, a laptop computer, or any other type of device configured to accept user input and transfer said user input to an application or server. For example, a user may enter, using client device 110, specifications that he or she wishes a material he or she intends to manufacture to possess. An exemplary list of specifications may include one or more of: targeting a particular value for the band gap energy of a semiconductor material, minimizing optical absorbance of a material used for optical devices or electronic displays, maximizing the number of cycles before significant capacity loss of materials used in rechargeable batteries, maximizing the conversion efficiency of materials used in photovoltaic devices, maximizing a functional figure of merit for materials used as thermoelectric devices, and/or fine-tuning the pore size of a porous material used for catalysis or carbon capture. The user may also enter, using client device 110, a design space, or a plurality of materials that form a design space, to be evaluated to determine whether materials in the design space satisfy the parameters. The term design space, as used herein, refers to one or more materials to be analyzed for partial or full conformity to parameters (parameters is interchangeably used with the term specifications herein) input by a user. The materials of a design space may be manually input by a user, may be stored in an entry of a database, or may be derived from a document (e.g., a crawler may scrape each mention of a material from a document that matches a search term input by a user, or that is specified by the user, such as an academic article). As an example, a design space might include various minerals that can be used to form glass, and parameters may include tensile strength being above a certain value, such as 10 megapascals, or elastic/Young's modulus of 60 gigapascals.

The input received from the user by client device 110 may be transmitted over network 120 to design space evaluation service 130. Network 120 is a communications network, such as the Internet. Though not depicted, in an embodiment, design space evaluation service 130 is installed as an application on client device 110, and need not be contacted over network 120. In the embodiment primarily referred to herein, design space evaluation service 130 is installed on one or more servers. Design space evaluation service 130 receives the user input that specifies one or more desired properties of a material, as well as a design space. Design space evaluation service 130 determines, based on the user input and various machine learning models, whether the design space is a high quality design space for identifying a material with the one or more desired properties. Design space evaluation service 130 outputs a recommendation as to whether the design space should be used by the user in connection with identifying the desired material.

Manufacturer 140 is a manufacturer of a material, and is optionally included in environment 100. In an embodiment, client device 100 identifies a material with the desired specifications by iterating on a design space recommended by design space evaluation service 130. Responsive to identifying the material, client device 110 transmits a request to manufacturer 140 to manufacture the material. Manufacturer 140 may manufacture the material for the user of client device 110.

Client Device Particulars

Figure 2:
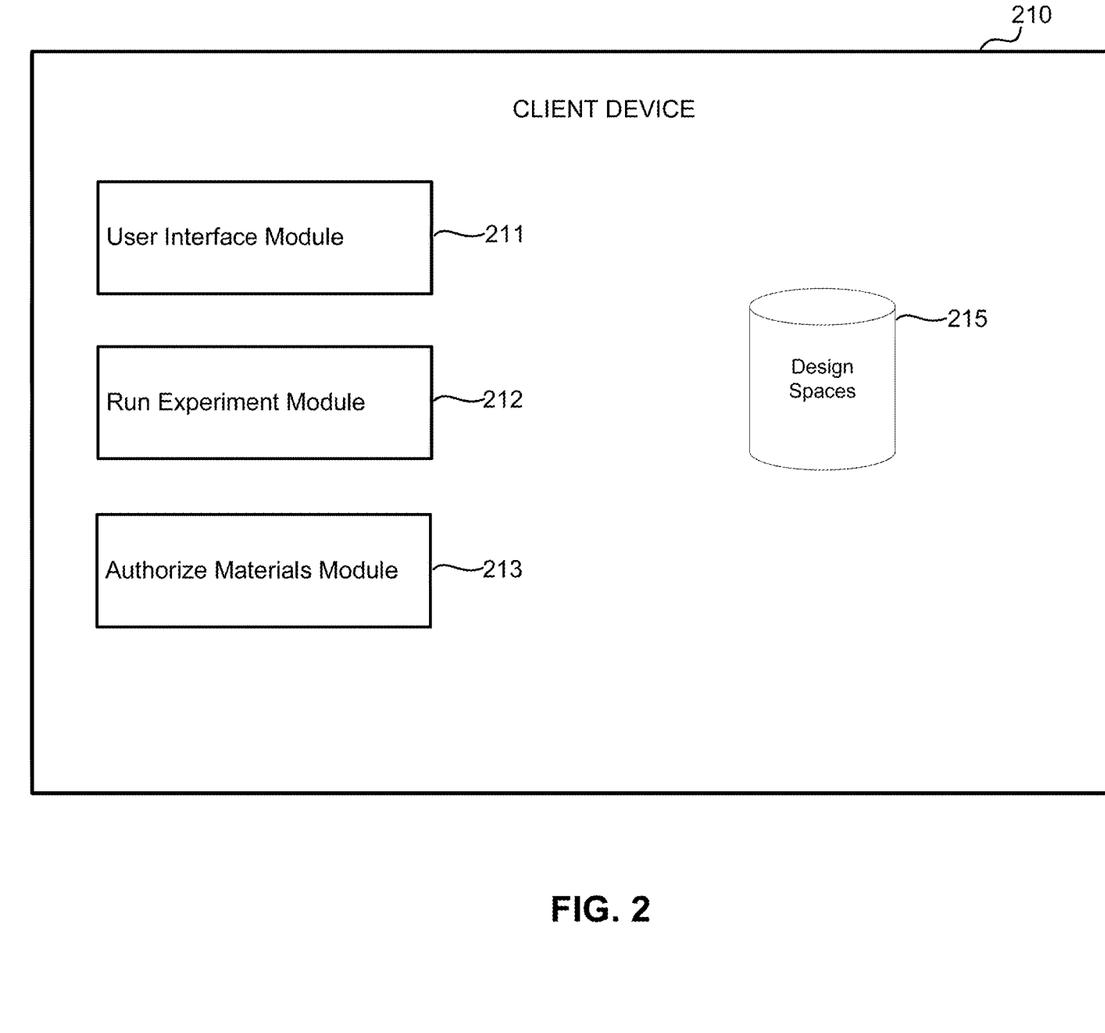
FIG. 2 illustrates one embodiment of detailed components of a client device that is configured to interact with the design space evaluation service.

FIG. 2 illustrates one embodiment of detailed components of a client device that is configured to interact with the design space evaluation service. Client device 210 includes user interface module 211, run experiment module 212, authorize materials module 213, and design spaces database 215. These modules and databases are exemplary; fewer or more modules may be used, and fewer or more databases may be implemented as well. The modules and applications depicted in FIG. 2 may be executed by a processor of client device 210. The execution of the modules and/or the applications may be driven by computer-readable instructions on a non-transitory computer-readable medium that, when executed, cause the processor to perform the operations described with respect to FIG. 2. Client device 210 may have any functionality described with respect to client device 110.

User interface module 211 receives input from a user. The input may include material property specifications, input of materials for a design space, a reference to an existing design space, and the like. The material property specifications may include degrees of freedom, such as composition and processing parameters of a desired material. User interface module 211 (as well as the other modules and databases of client device 210) may be part of a design space evaluation service module installed to client device 210 that is provided by, and configured to, communicate with design space evaluation service 130.

Run experiment module 212 runs iterations over a design space. In an embodiment, run experiment module 212 is executed based on manual input to run an experiment on a design space. In an embodiment, run experiment module 212 is executed in response to receiving, at client device 220, a recommendation by design space evaluation service 130 that a design space is high quality. Run experiment module 212 may be a part of an application offered by design space evaluation service 130, or may be a module that is part of a different application.

Authorize materials module 213 may transmit an authorization or recommendation to manufacturer 140 to manufacture one or more materials based on output of an experiment run by run experiment module 212. In an embodiment, the authorization or recommendation is transmitted automatically responsive to yielding a material with the desired specifications based on output from run experiment module 212. In an embodiment, a user is prompted to confirm whether the authorization is to be transmitted.

Design spaces database 215 is a database including entries that define materials that form part of one or more design spaces. The design spaces may be manually defined by a user. The design spaces may be preexisting, defined design spaces. Design spaces can also be specified by an optimization routine that searches a parameter space for viable candidates, or by a user input of a grid of candidates within a specified parameter range. Entries may also be populated by design space evaluation service retrieving publications that mention various materials in some connected fashion (e.g., the various materials are in the same article, or mentioned in connection with the same adjacent terms), and scraping the various materials into an entry. In an embodiment, a user may browse entries of design spaces database 215 (e.g., using a search function) using user interface module 211, and select a design space during the browsing for evaluation by design space evaluation service 130. Design spaces database 215 is depicted as part of client device 210, but may be, additionally or alternatively, located within design space evaluation service 130, or as a third-party database elsewhere within environment 100.

Design Space Evaluation Service Particulars

Figure 3:
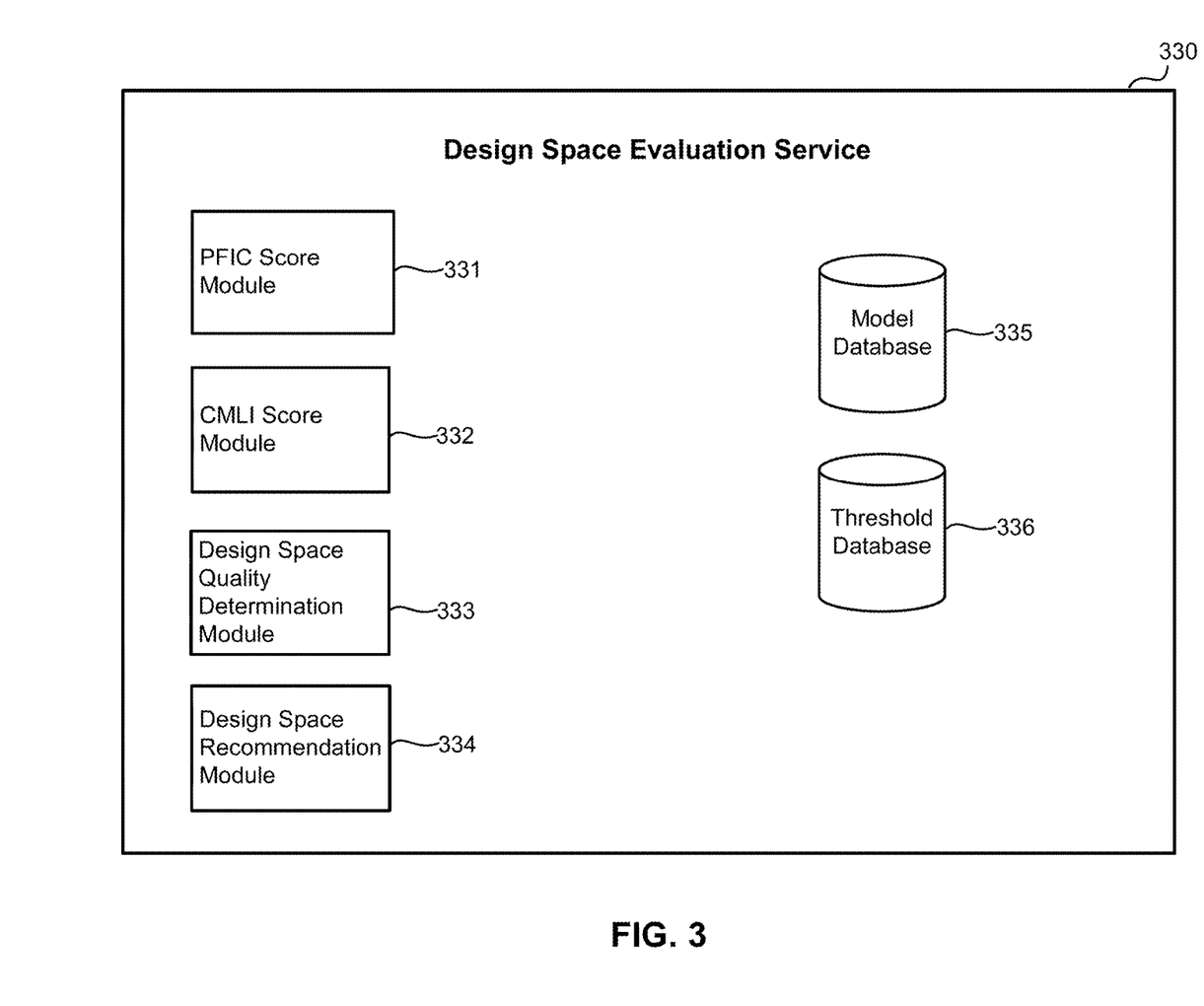
FIG. 3 depicts one embodiment of detailed components of a design space evaluation service.

FIG. 3 depicts one embodiment of detailed components of a design space evaluation service. Design space evaluation service includes Predicted Fraction of Improved Candidates (PFIC) score module 331, Cumulative Maximum Likelihood of Improvement (CMLI) score module 332, design space quality determination module 333, design space recommendation module 334, model database 335, and threshold database 336. These modules and databases are exemplary; fewer or more modules may be used, and fewer or more databases may be implemented as well. The modules and applications depicted in FIG. 3 may be executed by a processor of one or more computing devices, such as servers, on which design space evaluation service 330 is run. The execution of the modules and/or the applications may be driven by computer-readable instructions on a non-transitory computer-readable medium that, when executed, cause the processor to perform the operations described with respect to FIG. 3. Design space evaluation service 330 may have any functionality described with respect to design space evaluation service 110.

The PFIC score is a fraction of candidate materials in a design space that are predicted to have improved performance over the best training data point. The term best training data point (interchangeably used herein with "best data point"), as used herein, refers to data of a known material with a known property value for a particular property that, of other known materials, has the best known property value for that property. For example, a material may be known to withstand 90 GPa of pressure, which may be the highest amount of other materials in a training data set. Thus, for a machine learning model trained using the training data set, the data for the material that can withstand 90 GPa of pressure would be the best training data point.

PFIC score module 331 fits a machine learning model to the training data from which the best known property value is to be derived. The machine learning model may include random forests, support vector regressors, Gaussian process regressors, kernel ridge regressors, neural networks, polynomial regressors, and the like. One or more models may be stored to model database 335, which may be within design space service 330, or may be stored elsewhere in environment 100, but accessible to design space evaluation service 330. In an embodiment, the machine learning model is a random forest with linear leaves. At each leaf node in the random forest, a linear model is fit to the training data that reach the leaf node, and this enables the prediction of an improvement over the best training data point. In an embodiment, the maximum depth of each tree is set to a predefined value (e.g., thirty), and the minimum training points per split is set to a predefined value as well (e.g., 20). Further, the number of trees in the random forest may be set to a predefined amount, such as an amount equal to the size of the training set for each case. Regularization of the linear model coefficients may be implemented.

Regardless of which machine learning model is used, PFIC score module 331 applies the machine learning model to predict the performance of each candidate in the design space. For example, with respect to the specified properties, PFIC score module 331 predicts whether the candidates in the design space will achieve a property value higher for the one or more specified properties than the value in the best training data point. To inform this prediction, PFIC score module 331 inputs degrees of freedom (e.g., composition and processing parameters of a material) into the machine learning model, and receives material properties and property values as outputs of the machine learning model.

PFIC score module 331 may calculate the PFIC score by the following equation:

$$PFIC = \frac{N_{p(x_i) > b}}{\|X\|}$$

Where X is the design space, b is the performance of the best point in the training data, $\|X\|$ is the design space size, and N is a counted number of the candidates x of the design space X that satisfy the condition of having a predicted property value that is an improvement over that of the best point in the training data. Therefore, the numerator represents the number of candidates in the design space that the model predicts to be improvements over the best training data candidate, and the denominator is the total number of candidates in the design space. In an embodiment, maximization is assumed to be the goal in Equation 1; however, a minimization objective can be realized by subtracting the PFIC score from 1 (e.g., where a material is desired to have a smaller property value than that of a smallest value that forms a best training data point).

CMLI score module 332 determines a CMLI score, which reflects a predicted probability that at least one of the top n candidates from a design space represents an improvement over the best candidate from the training set. A user of client device 110 may determine how many n candidates should be considered by CMLI score module 332 (e.g., by way of input using user interface module 211). Alternatively, CMLI score module 332 may determine the number n of top candidates to user based on predetermined criteria (e.g., a predetermined amount, or a predetermined proportion or percentage of the total number of candidates in a design space). The term "top candidates" as used with respect to CMLI score module 332 refers to the candidates of the design space with the highest likelihoods of being an improvement over the best data point from the training set.

CMLI score module 332 uses one or more machine learning models (e.g., as retrieved from model database 335) to determine the likelihood for each candidate of a design space that that candidate will be an improvement over the best data point from the training set. In an embodiment, the machine learning model is a random forest model with constant-value leaves. CMLI score module 332 calculates uncertainty estimates, e.g., using a combination of an explicit bias model and jackknife-based methods, or using Bayesian uncertainty methods, or conventional cross-validation methods. The uncertainty estimates may be used to determine the distribution of the machine learning model error, in order to form a probability curve reflecting the likelihood that the candidate is an improvement. These embodiments are merely exemplary; CMLI score module 332 may use other models, such as Gaussian process regressors, or Bayesian regressors, to evaluate the CMLI score. Furthermore, any ensemble model could be used to evaluate the CMLI score if the variance among the ensemble predictions were taken as the model uncertainty.

CMLI score module 332 calculates a likelihood of improvement L of a given design candidate $x_i$, using one or more of the models. The model(s) are used to produce curves. Each respective curve reflects a respective probability distribution of property values for a specified material property that a respective candidate material will yield. In an embodiment, the CMLI score module 332 may then perform a likelihood calculation using the following equation:

$$L(x_i) = \int_b^\infty \aleph(p(x_i), \sigma(x_i))dx$$

Where $\aleph(\mu, \sigma)$ is a normal distribution of mean $\mu$ and standard deviation $\sigma$. The mean of the normal distribution is given by the machine learning model of the performance of candidate $x_i$ and the standard deviation is given by the uncertainty in that prediction. This integral therefore represents the predicted likelihood that the design candidate $x_i$ represents an improvement over the best training data candidate, based on the area under each respective curve. Maximization is the assumed goal in this integral; a minimization target, however, may be calculated by using integration limits of $-\infty$ and b. Different distributions may be used inside the integral for different distribution types (e.g., non-normal distribution).

CMLI score module 332 uses the likelihood of improvement L of the top n candidates of the design space to calculate the CMLI score. CMLI score module 332 calculates the CMLI score using the following equation:

$$CMLI = 1 - \prod_{i=1}^{n}(1 - L(x_i)).$$

The product used in this CMLI score equation is over the n candidates of from the design space with the highest likelihood L of improvement over the best training data candidate. Accordingly, CMLI score module 332 may assume that the predicted performances of these top n candidates are independent, and CMLI score module 332 assess the overall likelihood that at least one of these candidates represents an improvement.

Design space quality determination module 333 determines a quality level of the design space on the basis of the CMLI score and PFIC score. Design space quality determination module 333 retrieves a PFIC threshold and a CMLI threshold from threshold database 336. The PFIC and CMLI thresholds may be programmed by an administrator of design space evaluation service 330. Alternatively, the PFIC and CMLI thresholds may be input by the user of client device 110. Alternatively, the PFIC and CMLI thresholds may be preprogrammed and variable, where different materials correspond to different PFIC and CMLI thresholds, as mapped in entries of threshold database 336.

Design space quality determination module 333 compares the PFIC and CMLI scores to the PFIC and CMLI thresholds, respectively. Where both the PFIC and CMLI scores exceed the values of their corresponding thresholds, design space quality determination module 333 determines that the design space is of high quality. Where one, but not the other, of the PFIC and CMLI scores exceed the values of their corresponding thresholds, design space quality determination module 333 determines that the design space is of unknown quality. Where neither the PFIC score, nor the CMLI score, exceeds the value of their corresponding thresholds, design space quality determination module 333 determines that the design space is of low quality.

Design space recommendation module 334 outputs a recommendation (e.g., to client device 220 via user interface module 221) corresponding to the quality determination. In an embodiment, the recommendation indicates that the user should proceed where the quality determination is high for a design space. The recommendation may indicate that the user should not proceed where the quality determination is low for a design space. The recommendation may indicate that the user should, or should not, proceed where the quality determination is unknown. Regardless of the recommendation, design space recommendation module 334 may include, with the recommendation, a ranked list of some or all of the candidate materials within the design space, the rank being based on their likelihood that they will have a value that exceeds the best data point. Where the design space is being tested for multiple parameters, the recommendation may be configurable by the user, where the user may sort the ranked list based on a specified parameter of interest (e.g., by the user selecting from a menu of parameters which parameter is of interest, whereby the ranked list is re-ranked based on the selection). In an embodiment, the ranked list is limited to the top n candidates (e.g., based on user selection of a filtering option).

Computing Machine Architecture

Figure 4:
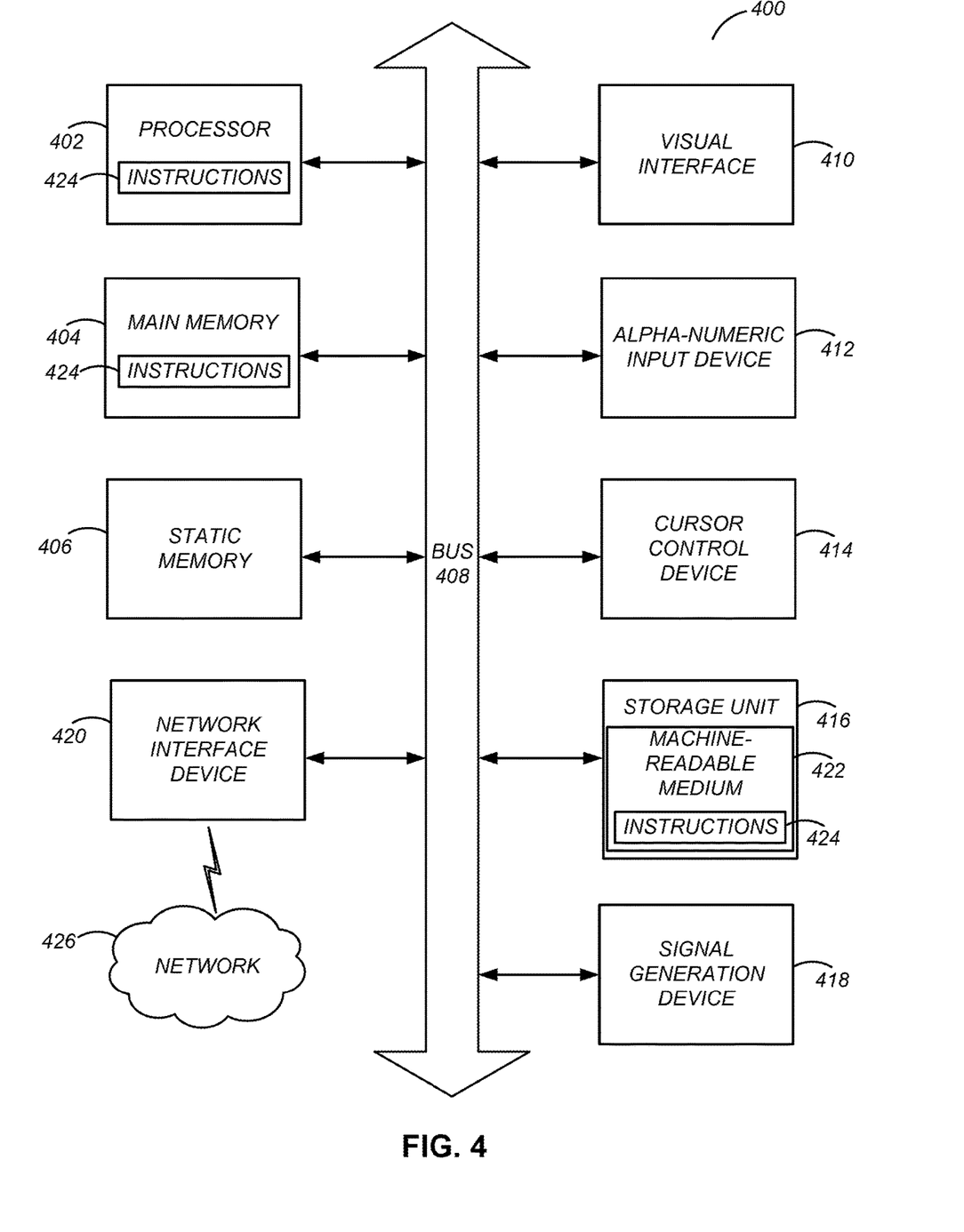
FIG. 4 is a block diagram illustrating components of an example machine able to read instructions from a machine-readable medium and execute them in a processor (or controller).

FIG. (FIG. 4 is a block diagram illustrating components of an example machine able to read instructions from a machine-readable medium and execute them in a processor (or controller). Specifically, FIG. 4 shows a diagrammatic representation of a machine in the example form of a computer system 400 within which program code (e.g., software) for causing the machine to perform any one or more of the methodologies discussed herein may be executed. The program code may be comprised of instructions 424 executable by one or more processors 402. In alternative embodiments, the machine operates as a stand-alone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), a tablet PC, a set-top box (STB), a personal digital assistant (PDA), a cellular telephone, a smartphone, a web appliance, a network router, switch or bridge, or any machine capable of executing instructions 424 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein.

The example computer system 400 includes a processor 402 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 404, and a static memory 406, which are configured to communicate with each other via a bus 408. The computer system 400 may further include visual display interface 410. The visual interface may include a software driver that enables displaying user interfaces on a screen (or display). The visual interface may display user interfaces directly (e.g., on the screen) or indirectly on a surface, window, or the like (e.g., via a visual projection unit). For ease of discussion the visual interface may be described as a screen. The visual interface 410 may include or may interface with a touch enabled screen. The computer system 400 may also include alphanumeric input device 412 (e.g., a keyboard or touch screen keyboard), a cursor control device 414 (e.g., a mouse, a trackball, a joystick, a motion sensor, or other pointing instrument), a storage unit 416, a signal generation device 418 (e.g., a speaker), and a network interface device 420, which also are configured to communicate via the bus 408.

The storage unit 416 includes a machine-readable medium 422 on which is stored instructions 424 (e.g., software) embodying any one or more of the methodologies or functions described herein. The instructions 424 (e.g., software) may also reside, completely or at least partially, within the main memory 404 or within the processor 402 (e.g., within a processor's cache memory) during execution thereof by the computer system 400, the main memory 404 and the processor 402 also constituting machine-readable media. The instructions 424 (e.g., software) may be transmitted or received over a network 426 via the network interface device 420.

While machine-readable medium 422 is shown in an example embodiment to be a single medium, the term "machine-readable medium" should be taken to include a single medium or multiple media (e.g., a centralized or distributed database, or associated caches and servers) able to store instructions (e.g., instructions 424). The term "machine-readable medium" shall also be taken to include any medium that is capable of storing instructions (e.g., instructions 424) for execution by the machine and that cause the machine to perform any one or more of the methodologies disclosed herein. The term "machine-readable medium" includes, but not be limited to, data repositories in the form of solid-state memories, optical media, and magnetic media.

Exemplary User Interface Components

Figure 5:
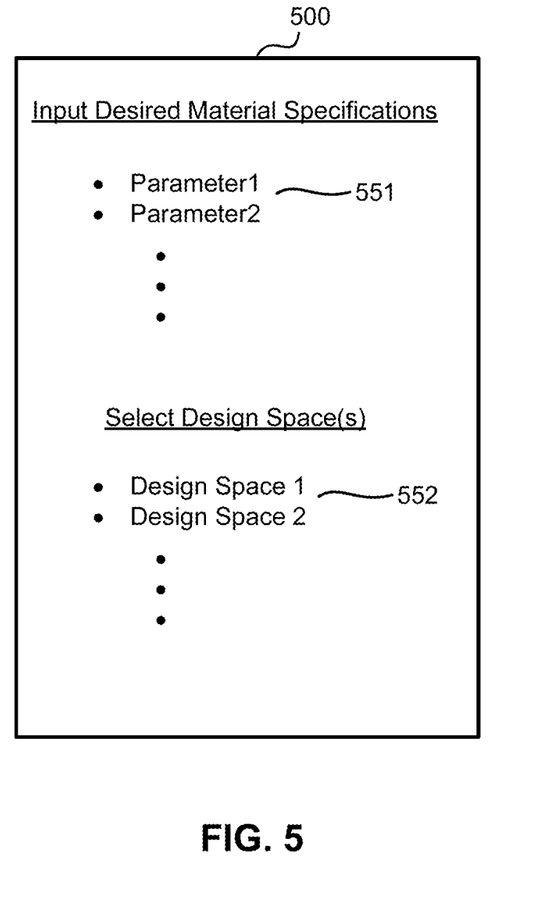
FIG. 5 depicts one embodiment of an exemplary user interface for input by a user of material specifications and/or design spaces.

FIG. 5 depicts one embodiment of an exemplary user interface for input by a user of material specifications and/or design spaces. User interface 500 may be an interface of client device 210, as generated by user input module 211. A user may input parameters 551. Parameters 551 may be a specified property (e.g., tensile strength), as well as a minimum or maximum value desired for that specified property. The parameters may be typed in by a user, selected from a menu, or specified in any other known manner. A user may also input design spaces 552 in the same manner. Design space evaluation service 130 then evaluates the quality of the design space(s) 552 for finding parameters 551 in accordance with the above disclosure.

Figure 6:
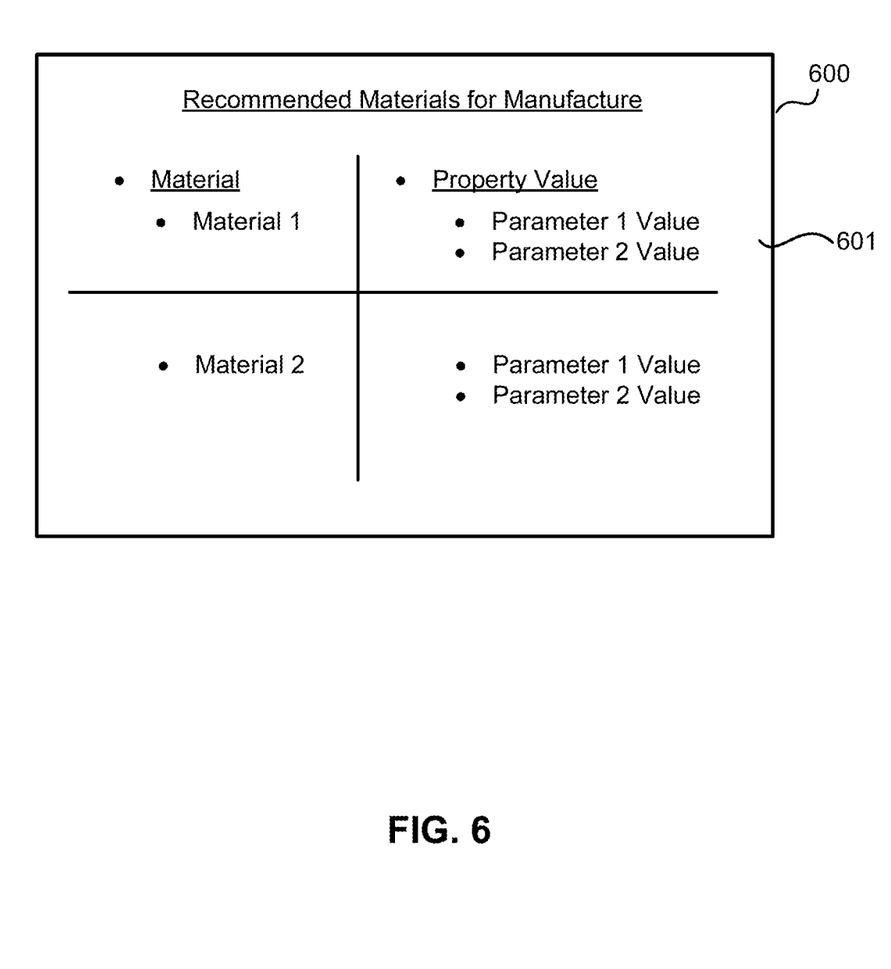
FIG. 6 depicts one embodiment of an exemplary user interface for analyzing materials examined in a design space.

FIG. 6 depicts one embodiment of an exemplary user interface for analyzing materials examined in a design space. In an embodiment, after a recommendation of a design space being of high, unknown, or low quality, a user may choose to experiment on the design space. Design space evaluation service 130 may execute the experiment, or may receive results of the experiment. In such a case, design space evaluation service 130 may output a ranked list of materials that satisfy the specifications input by the user, and are thus suitable for manufacture. User interface 600 depicts a ranked list of materials 601, ranked according to their suitability. Suitability is determined based on the parameter values of each material relative to the desired specifications. In an embodiment, materials 601 are selectable, and, responsive to receiving a selection of a material of materials 601, instructions are transmitted to manufacturer 140 to manufacture the selected material.

Exemplary Data Flow

Figure 7:
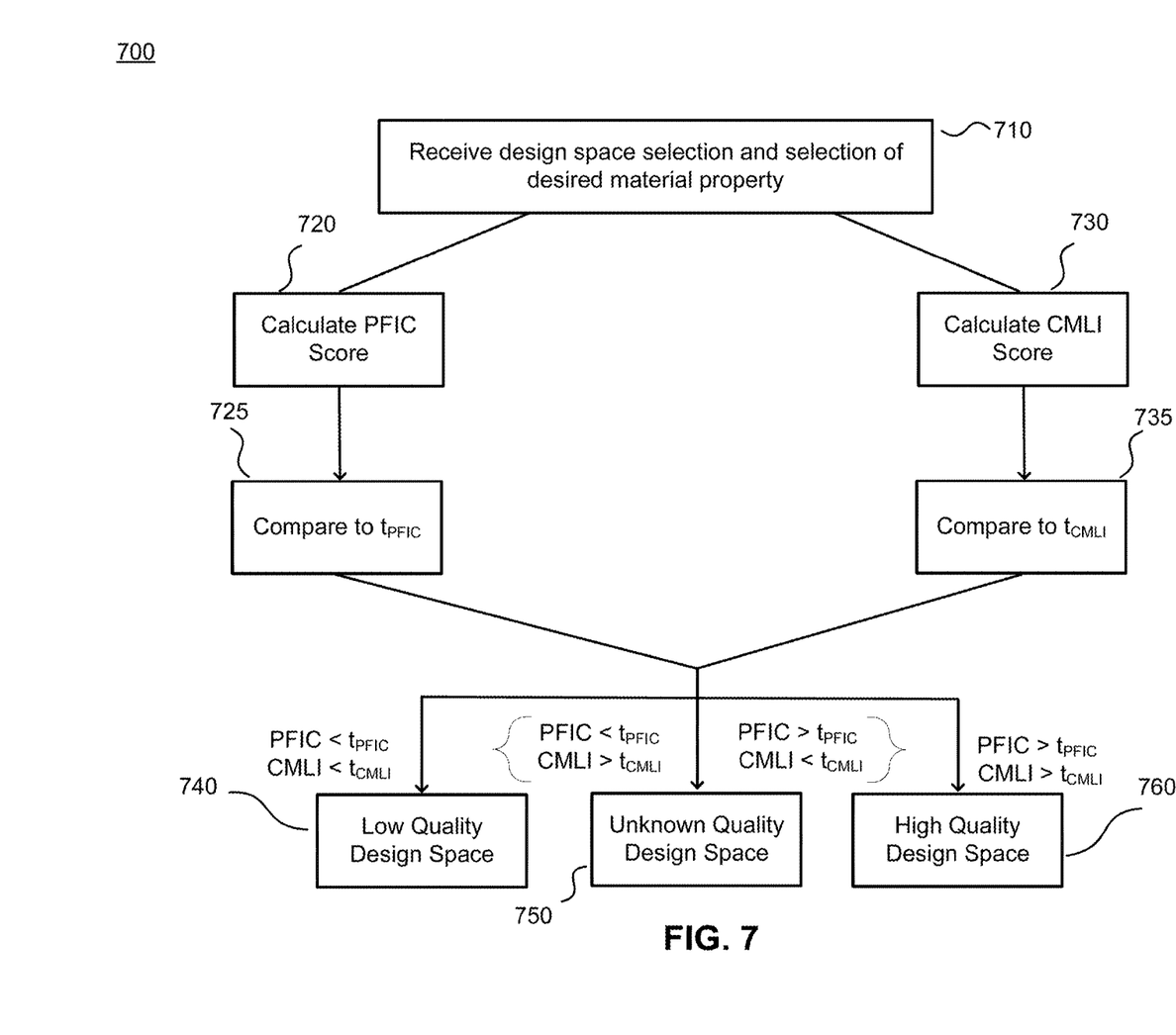
FIG. 7 depicts one embodiment of an exemplary data flow for evaluating design spaces.

FIG. 7 depicts one embodiment of an exemplary data flow for evaluating design spaces. Data flow 700 begins with design space evaluation service 130 receiving 710 design space selection and specification of desired material properties (e.g., using user interface module 211 of client device 210). Either in parallel, or serially, design space evaluation service 130 calculates 720 a PFIC score and calculates 730 a CMLI score based on the received selections (e.g., using PFIC score module 331 and CMLI score module 332, respectively). Design space evaluation service 130 compares 725 the PFIC score to a threshold PFIC score, and compares 735 the CMLI score to a threshold CMLI score. Design space evaluation service 130 uses the results of the comparison to determine, using design space recommendation module 34, whether the design space quality is low, unknown, or high. Design space evaluation service 130 determines 740 that the design space quality is low where both the PFIC score and CMLI score are below their respective thresholds. Design space evaluation service 130 determines 750 that the design space quality is unknown where one of the PFIC score and the CMLI score is below its respective threshold, and the other of the PFIC score and the CMLI score is above its respective threshold. Design space evaluation service 130 determines 760 that the design space quality is high where both of the PFIC score and the CMLI score are above their respective thresholds. While not depicted, data flow 700 may go on to generate for display a recommendation as to whether to proceed with experimenting on a design space based on the design space quality, and may proactively cause experimentation to occur for high quality design spaces. In an embodiment, where one or more suitable materials are found, data flow 700 may include design space evaluation service 130 transmitting a request to manufacturer 140 to manufacture one or more of the suitable materials.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for evaluating the quality of design spaces through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for determining material design space quality, the method comprising:
   receiving input, from a user, of a specified material property and a design space, the design space comprising a plurality of candidate materials;
   identifying a best data point, from a set of training data that was used to train a first model, having a highest property value of the set for the specified material property;
   for each respective candidate material of the design space:
      inputting the respective candidate material into the first model;
      receiving, as output from the first model, a respective property value for the specified material property;
      determining whether the respective property value exceeds the property value of the best data point;
      responsive to determining that the respective property value exceeds the property value of the best data point, adding the respective candidate material to a subset of candidate materials;
   determining a Predicted Fraction of Improved Candidates (PFIC) score by dividing a total number of candidate materials in the subset of candidate materials by a total number of candidate materials in the design space;
   generating, using a second model, a plurality of curves, each respective curve of the plurality of curves reflecting a respective probability distribution of property values for the specified material property that a respective candidate material will yield;
   determining a Cumulative Maximum Likelihood of Improvement (CMLI) score that indicates the probability that the design space comprises at least one candidate material with a property value that exceeds the property value of the best data point based on a subset of the plurality of respective curves;
   determining that the design space is of high quality responsive to determining that both the PFIC score exceeds a PFIC threshold score, and the CMLI score exceeds a CMLI threshold score;
   determining that the design space is of unknown quality responsive to determining either that:
      the PFIC score is above the PFIC threshold score and the CMLI score is below the CMLI threshold score, or
      the PFIC score is below the PFIC threshold score and the CMLI score exceeds the CMLI threshold score;
   responsive to determining that the design space is of high quality, outputting, to the user, a recommendation to proceed with the design space; and
   responsive to determining that the design space is of unknown quality, outputting, to the user, a recommendation indicating that the design space is of unknown quality.

2. The method of claim 1, wherein determining the CMLI score further comprises:
   receiving user input of an amount n of the plurality of candidate materials from which the CMLI score is to be derived; and
   limiting the subset of the plurality of respective curves to include n curves of the plurality of curves.

3. The method of claim 2, wherein outputting, to the user, a recommendation to proceed with the design space comprises outputting a ranked list of the candidate materials in order of their likelihood of having a property value that exceeds the property value of the best data point.

4. The method of claim 3, further comprising limiting the ranked list to n candidate materials.

5. The method of claim 1, wherein determining the CMLI score further comprises:
limiting the subset of the plurality of respective curves to include a predefined percentage of the plurality of curves, each curve of the predefined percentage reflecting a highest likelihood, relative to others of the plurality of curves, that their respective candidate materials have a property value that exceeds the property value of the best data point.

6. The method of claim 1, further comprising:
determining that the design space is of low quality responsive to determining that both the PFIC score is below the PFIC threshold score, and the CMLI score is below the CMLI threshold score; and
responsive to determining that the design space is of low quality, outputting, to the user, a recommendation not to proceed with the design space.

7. A non-transitory computer-readable medium comprising memory with instructions encoded thereon for determining material design space quality, the instructions, when executed, causing a processor to execute operations, the instructions comprising instructions to:
receive input, from a user, of a specified material property and a design space, the design space comprising a plurality of candidate materials;
identify a best data point, from a set of training data that was used to train a first model, having a highest property value of the set for the specified material property;
for each respective candidate material of the design space:
input the respective candidate material into the first model;
receive, as output from the first model, a respective property value for the specified material property;
determine whether the respective property value exceeds the property value of the best data point;
responsive to determining that the respective property value exceeds the property value of the best data point, add the respective candidate material to a subset of candidate materials;
determine a Predicted Fraction of Improved Candidates (PFIC) score by dividing a total number of candidate materials in the subset of candidate materials by a total number of candidate materials in the design space;
generate, using a second model, a plurality of curves, each respective curve of the plurality of curves reflecting a respective probability distribution of property values for the specified material property that a respective candidate material will yield;
determine a Cumulative Maximum Likelihood of Improvement (CMLI) score that indicates the probability that the design space comprises at least one candidate material with a property value that exceeds the property value of the best data point based on a subset of the plurality of respective curves;
determine that the design space is of high quality responsive to determining that both the PFIC score exceeds a PFIC threshold score, and the CMLI score exceeds a CMLI threshold score;
determine that the design space is of unknown quality responsive to determining either that:
the PFIC score is above the PFIC threshold score and the CMLI score is below the CMLI threshold score, or
the PFIC score is below the PFIC threshold score and the CMLI score exceeds the CMLI threshold score;
responsive to determining that the design space is of high quality, output, to the user, a recommendation to proceed with the design space; and
responsive to determining that the design space is of unknown quality, output, to the user, a recommendation indicating that the design space is of unknown quality.

8. The non-transitory computer-readable medium of claim 7,
wherein the instructions to determine the CMLI score further comprise instructions to:
receive user input of an amount n of the plurality of candidate materials from which the CMLI score is to be derived; and
limit the subset of the plurality of respective curves to include n curves of the plurality of curves.

9. The non-transitory computer-readable medium of claim 8, wherein the instructions to output, to the user, a recommendation to proceed with the design space comprise instructions to output a ranked list of the candidate materials in order of their likelihood of having a property value that exceeds the property value of the best data point.

10. The non-transitory computer-readable medium of claim 9, further comprising limiting the ranked list to n candidate materials.

11. The non-transitory computer-readable medium of claim 7, wherein the instructions to determine the CMLI score further comprise instructions to:
limit the subset of the plurality of respective curves to include a predefined percentage of the plurality of curves, each curve of the predefined percentage reflecting a highest likelihood, relative to others of the plurality of curves, that their respective candidate materials have a property value that exceeds the property value of the best data point.

12. The non-transitory computer-readable medium of claim 7, the instructions further comprising instructions to:
determine that the design space is of low quality responsive to determining that both the PFIC score is below the PFIC threshold score, and the CMLI score is below the CMLI threshold score; and
responsive to determining that the design space is of low quality, output, to the user, a recommendation not to proceed with the design space.

13. A system for determining material design space quality, the system comprising:
a processor; and
a non-transitory computer-readable medium comprising memory with instructions encoded thereon, the processor configured, when executing the instructions, to:
receive input, by a user, of a specified material property and a design space, the design space comprising a plurality of candidate materials;
identify a best data point, from a set of training data that was used to train a first model, having a highest property value of the set for the specified material property;
for each respective candidate material of the design space:
input the respective candidate material into the first model;
receive, as output from the first model, a respective property value for the specified material property;

determine whether the respective property value exceeds the property value of the best data point;

responsive to determining that the respective property value exceeds the property value of the best data point, add the respective candidate material to a subset of candidate materials;

determine a Predicted Fraction of Improved Candidates (PFIC) score by dividing a total number of candidate materials in the subset of candidate materials by a total number of candidate materials in the design space;

generate, using a second model, a plurality of curves, each respective curve of the plurality of curves reflecting a respective probability distribution of property values for the specified material property that a respective candidate material will yield;

determine a Cumulative Maximum Likelihood of Improvement (CMLI) score that indicates the probability that the design space comprises at least one candidate material with a property value that exceeds the property value of the best data point based on a subset of the plurality of respective curves;

determine that the design space is of high quality responsive to determining that both the PFIC score exceeds a PFIC threshold score, and the CMLI score exceeds a CMLI threshold score;

determine that the design space is of unknown quality responsive to determining either that:
the PFIC score is above the PFIC threshold score and the CMLI score is below the CMLI threshold score, or
the PFIC score is below the PFIC threshold score and the CMLI score exceeds the CMLI threshold score;

responsive to determining that the design space is of high quality, output, to the user, a recommendation to proceed with the design space; and responsive to determining that the design space is of unknown quality, output, to the user, a recommendation indicating that the design space is of unknown quality.

14. The system of claim 13, wherein the processor is further configured, when determining the CMLI score, to:

receive user input of an amount n of the plurality of candidate materials from which the CMLI score is to be derived; and limit the subset of the plurality of respective curves to include n curves of the plurality of curves.

15. The system of claim 14, wherein the processor is further configured, when outputting, to the user, a recommendation to proceed with the design space, to output a ranked list of the candidate materials in order of their likelihood of having a property value that exceeds the property value of the best data point.

16. The system of claim 15, wherein the processor is further configured to limit the ranked list to n candidate materials.

17. The system of claim 13, wherein the processor is further configured, when determining the CMLI score, to:

limit the subset of the plurality of respective curves to include a predefined percentage of the plurality of curves, each curve of the predefined percentage reflecting a highest likelihood, relative to others of the plurality of curves, that their respective candidate materials have a property value that exceeds the property value of the best data point.

18. The system of claim 13, wherein the processor is further configured to:

determine that the design space is of low quality responsive to determining that both the PFIC score is below the PFIC threshold score, and the CMLI score is below the CMLI threshold score; and responsive to determining that the design space is of low quality, output, to the user, a recommendation not to proceed with the design space.

* * * * *